(12) United States Patent
Hannam et al.

(10) Patent No.: US 10,400,626 B2
(45) Date of Patent: Sep. 3, 2019

(54) VANE SEGMENT FOR A GAS TURBINE

(71) Applicant: Siemens Aktiengesellschaft, Munich (DE)

(72) Inventors: Steve Hannam, North Hykeham (GB); Paul Padley, Tattershall (GB); Paul Mathew Walker, Dunholme (GB); Jonathan Wells, Welton (GB)

(73) Assignee: Siemens Aktiengesellschaft, Munich (DE)

( * ) Notice: Subject to any disclaimer, the term of this patent is extended or adjusted under 35 U.S.C. 154(b) by 9 days.

(21) Appl. No.: 15/559,560

(22) PCT Filed: Mar. 24, 2016

(86) PCT No.: PCT/EP2016/056553
§ 371 (c)(1),
(2) Date: Sep. 19, 2017

(87) PCT Pub. No.: WO2016/156200
PCT Pub. Date: Oct. 6, 2016

(65) Prior Publication Data
US 2018/0045072 A1 Feb. 15, 2018

(30) Foreign Application Priority Data

Apr. 1, 2015 (EP) .................................. 15162152

(51) Int. Cl.
F01D 25/08 (2006.01)
F01D 5/14 (2006.01)
(Continued)

(52) U.S. Cl.
CPC .............. *F01D 25/08* (2013.01); *C23C 4/134* (2016.01); *C23C 14/221* (2013.01); *C25D 3/56* (2013.01);
(Continued)

(58) Field of Classification Search
CPC ........ F01D 5/288; F01D 5/286; F01D 25/007; C23C 28/3215; C23C 28/321;
(Continued)

(56) References Cited

U.S. PATENT DOCUMENTS 6,875,529 B1* 4/2005 Spitsberg .............. C04B 35/486
416/241 B
2004/0005477 A1 1/2004 Tamm
(Continued)

FOREIGN PATENT DOCUMENTS

WO 9955527 A2 11/1999

OTHER PUBLICATIONS

EP Search Report dated Sep. 18, 2015, for EP patent application No. 15162152.1.
(Continued)

*Primary Examiner* — Long T Tran
(74) *Attorney, Agent, or Firm* — Beusse Wolter Sanks & Maire

(57) ABSTRACT

A vane device for a gas turbine having an inner shroud and an outer shroud, an aerofoil arranged between the inner shroud and the outer shroud, the aerofoil and/or inner shroud and/or an outer shroud having a first layer of MCrAlY coating over a substrate, a coated surface section which is coated with a thermal barrier coating over the first layer of MCrAlY coating, a second layer of MCrAlY coating provided between the first layer of MCrAlY and the thermal barrier coating of the coated surface section.

17 Claims, 3 Drawing Sheets

(51) Int. Cl.
| | |
|---|---|
| *F01D 5/28* | (2006.01) |
| *F01D 9/04* | (2006.01) |
| *C23C 4/134* | (2016.01) |
| *C23C 14/22* | (2006.01) |
| *C25D 3/56* | (2006.01) |
| *C25D 5/48* | (2006.01) |
| *C25D 7/00* | (2006.01) |
| *F01D 25/00* | (2006.01) |

(52) U.S. Cl.
CPC ............... *C25D 5/48* (2013.01); *C25D 7/008* (2013.01); *F01D 5/14* (2013.01); *F01D 5/288* (2013.01); *F01D 9/041* (2013.01); *F01D 25/005* (2013.01); *F05D 2220/32* (2013.01); *F05D 2230/10* (2013.01); *F05D 2230/311* (2013.01); *F05D 2230/312* (2013.01); *F05D 2230/313* (2013.01); *F05D 2230/90* (2013.01); *F05D 2240/123* (2013.01); *F05D 2240/15* (2013.01); *F05D 2260/231* (2013.01); *F05D 2300/611* (2013.01)

(58) Field of Classification Search
CPC ..... C23C 30/00; C23C 4/073; F05D 2230/90; F05D 2300/611; F05D 2230/313; F05D 2300/175
See application file for complete search history.

(56) References Cited

U.S. PATENT DOCUMENTS

| | | | |
|---|---|---|---|
| 2004/0180233 A1 | 9/2004 | Stamm | |
| 2005/0003227 A1* | 1/2005 | Khan | C23C 28/321 428/632 |
| 2011/0014060 A1* | 1/2011 | Bolcavage | F01D 5/288 416/241 R |
| 2011/0143163 A1* | 6/2011 | Halberstadt | C23C 4/18 428/656 |
| 2011/0268987 A1* | 11/2011 | Schmitz | C23C 28/022 428/654 |
| 2013/0260130 A1* | 10/2013 | Taxacher | C23C 28/321 428/292.1 |
| 2014/0065361 A1* | 3/2014 | Rosenzweig | C23C 4/00 428/141 |
| 2014/0186656 A1* | 7/2014 | Tryon | F02C 7/00 428/666 |
| 2014/0342186 A1* | 11/2014 | Bostanjoglo | B32B 15/01 428/678 |
| 2015/0030871 A1 | 1/2015 | Bruck et al. | |
| 2015/0300200 A1* | 10/2015 | Walker | C23C 10/02 428/680 |
| 2015/0322818 A1* | 11/2015 | Hannam | F01D 5/288 415/177 |

OTHER PUBLICATIONS

International Search Report dated Jul. 5, 2016, for PCT/EP2016/056553.

* cited by examiner

VANE SEGMENT FOR A GAS TURBINE

CROSS REFERENCE TO RELATED APPLICATIONS

This application is the US National Stage of International Application No. PCT/EP2016/056553 filed Mar. 24, 2016, and claims the benefit thereof. The International Application claims the benefit of European Application No. EP15162152 filed Apr. 1, 2015. All of the applications are incorporated by reference herein in their entirety.

FIELD OF INVENTION

The present invention relates to a vane segment for a gas turbine, in particular a vane segment with a TBC (Thermal Barrier Coating) and to a method for manufacturing a vane segment for a gas turbine.

ART BACKGROUND

The stator vanes and the rotor blades in a gas turbine are exposed to the high temperature of the working fluid passing the vanes and the blades. Due to the high temperature a significant oxidation of the base alloy can occur at the leading edge of an aerofoil of the stator vane or, the rotor blade. Furthermore, oxidation at the inner platform of the inner shroud and/or outer shroud of the stator vane or the rotor blade can also occur. Such degradation is currently the life limiting mechanism on this component.

To address this problem, it is known to provide the components subject to high temperature with a Platinum-Aluminide (PtAl) or MCrAlY first coating applied to the base material substrate of the component. Thermal Barrier Coating (TBC) 'patches' provided over the first coating afford additional high temperature protection to local areas of the stator vane or rotor blade that would otherwise be life-limiting for the component. TBC patches are typically made of ceramic material. At the patches location it is in particular known to apply a High Velocity Oxy-Fuel (HVOF) MCrAlY coating to the base material substrate, instead of the PtAl coating, for promoting the bonding of the TBC coating. The TBC coating is then applied on top of the HVOF MCrAlY coating. The use of an HVOF MCrAlY layer in direct contact with the TBC patches is deemed necessary to prevent premature delamination of the TBC coating.

Such procedure, involving two different coatings over the base material substrate, i.e. a HVOF MCrAlY coating below the TBC patches and a PtAl coating over the rest of the substrate, is considered not practical and not cost effective.

SUMMARY OF THE INVENTION

It may be an object of the present invention to provide a more heat resistant vane segment for a gas turbine with reduced manufacturing cost and weight.

The subject may be solved by a vane segment for a gas turbine and by a method for manufacturing a vane segment arrangement for a gas turbine.

According to a first aspect of the present invention, a vane device (segment) for a gas turbine is presented. The vane device comprises:—an inner shroud and an outer shroud,—at least an aerofoil arranged between the inner shroud and the outer shroud,—the aerofoil and/or inner shroud and/or an outer shroud,—comprising a first layer of MCrAlY coating over a substrate for providing thermal protection to the substrate,—at least a coated surface section which is coated with a thermal barrier coating over the first layer of MCrAlY coating for providing additional protection at high temperature, wherein a second layer of MCrAlY coating is provided between the first layer of MCrAlY and the thermal barrier coating of the coated surface section.

According to a second aspect of the present invention, a method for manufacturing a vane device for a gas turbine, wherein the vane device comprises an inner shroud and an outer shroud, at least an aerofoil arranged between the inner shroud and the outer shroud, the inner shroud, the outer shroud and the aerofoil defining a gas path for a working fluid of the gas turbine, the method comprising:—coating a substrate of the aerofoil and/or inner shroud and/or an outer shroud with a first layer of MCrAlY coating for providing thermal protection to the substrate,—coating a second layer of MCrAlY coating over a portion of the first layer of MCrAlY coating,—coating a thermal barrier coating over the second layer of MCrAlY coating for providing a coated surface section having additional protection at high temperature.

The present invention provide a first layer of MCrAlY coating over the entire substrate and a second layer of MCrAlY coating between the first layer and the TBC patches. The two layers, being of the same material, are compatible with each other. Being the two layers distinct from each other they can be obtained with different process, with the aim for example, to obtain different roughness. A smoother surface of the first layer may improve the resistance to oxidation at high temperature where no TBC patch is applied. A rougher surface of the second layer may promote the bonding of the upper TBC layer. The combination of the TBC patches with the first layer and the second layer of MCrAlY coating provides a stable and resistant protection against heat and oxidation.

According to a possible embodiment of the present invention, the first layer of MCrAlY coating is obtained by means of an electroplating (EP) process. Advantageously, the first layer of MCrAlY provide a surface which is suitable for being exposed to the high temperature oxidising environment in service, in particular the surfaces which are not subject to TBC coating. The electroplating process assures that these surfaces achieve the requirement to be smooth in order to reduce heat transfer into the component.

A further smoothing can be achieved by vibro-polishing the first layer of EP MCrAlY coating. This further improves the oxidation life of the EP MCrAlY coating and therefore ensures the design life of the component is met.

So the component has a requirement to have a smooth MCrAlY coated surface on the areas that are not to be TBC coated. But, the component has a requirement to have a 'rough' and irregular MCrAlY surface where TBC coating is required.

According to a possible embodiment of the present invention, the second layer of MCrAlY coating is obtained by means of an Air Plasma Spray (APS) process. The APS process provides a second layer of MCrAlY, in order to produce a rougher and irregular, with respect to the first layer, MCrAlY surface on top of the EP first MCrAlY layer, to ensure that the TBC does not prematurely delaminate in service. This will ensure that component design life will be met According to another possible embodiment of the present invention, the first layer of MCrAlY coating covers the entire substrate of the aerofoil and/or inner shroud and/or an outer shroud along a gas path of a working fluid of the gas turbine. Advantageously, this provides a common first layer to the entire surface of the gas path, i.e. the entire surface washed by the hot working gas of the gas turbine, including areas having TBC and areas which are free from thermal barrier coating.

According to a further possible embodiment of the present invention, the aerofoil comprises a suction side and a pressure side, the suction side comprising at least a first coated surface section which is coated with a thermal barrier coating. Advantageously, this provides a TBC where it has been measured that the hottest sections of the surface of the respective aerofoils are, i.e. at the suction side of the respective aerofoils.

The inner shroud and the outer shroud respectively comprise a first inner platform and a second inner platform. According to a possible embodiment of the present invention, the first inner platform and/or the second inner platform comprising a further coated surface section coated with a thermal barrier coating. In particular, the further coated surface section may be located downstream of a trailing edge of the aerofoil. Advantageously, this provides a TBC area where it has been additionally found that hot spots caused by the working fluid exist, i.e. in the region of the inner platform downstream of the trailing edges of the aerofoils.

It has to be noted that embodiments of the invention have been described with reference to different subject matters. In particular, some embodiments have been described with reference to apparatus type claims whereas other embodiments have been described with reference to method type claims. However, a person skilled in the art will gather from the above and the following description that, unless otherwise notified, in addition to any combination of features belonging to one type of subject matter also any combination between features relating to different subject matters, in particular between features of the apparatus type claims and features of the method type claims is considered as to be disclosed with this application.

BRIEF DESCRIPTION OF THE DRAWINGS

The aspects defined above and further aspects of the present invention are apparent from the examples of embodiment to be described hereinafter and are explained with reference to the examples of embodiment. The invention will be described in more detail hereinafter with reference to examples of embodiment but to which the invention is not limited.

DETAILED DESCRIPTION

Figure 1:
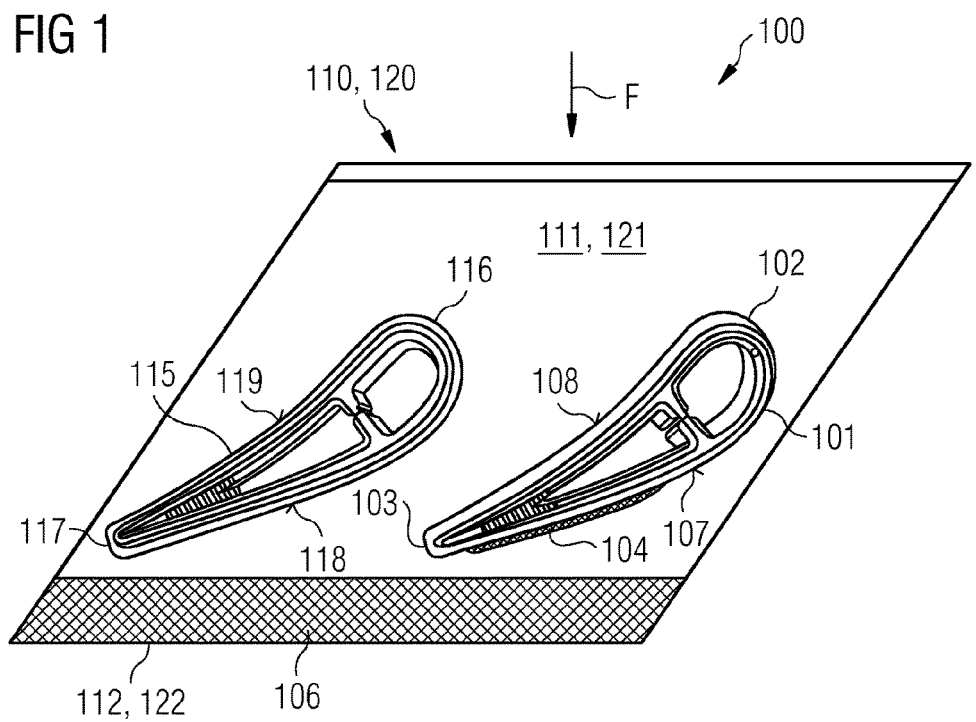
FIG. 1 shows a schematic view of a vane segment comprising two aerofoils according to an exemplary embodiment of the present invention.

The illustrations in the drawings are schematic. It is noted that in different figures, similar or identical elements are provided with the same reference signs.

FIG. 1 shows a vane device (segment) 100 for a gas turbine. The vane device 100 comprises a first aerofoil 101 comprising a first suction side 107 and a first pressure side 108, a second aerofoil 115 comprising a second suction side 118 and a second pressure side 119, an inner shroud 110 and an outer shroud 120. The first aerofoil 101 and the second aerofoil 115 are arranged between the inner shroud 110 and the outer shroud 120 and are spaced apart from each other along a circumferential direction with respect to a rotary axis of the gas turbine.

According to other embodiments of the present invention, a vane device (segment) 100 for a gas turbine comprises more aerofoils than the two aerofoils 101, 115 shown in FIG. 1.

The inner shroud 110 comprises an inner platform 111 and the outer shroud 120 comprises a further inner platform 121. According to the view shown in FIG. 1, the shown inner platform 111, 121 may be the respective inner platform 111, 121 of the inner shroud 110 or of the outer shroud 120. The first aerofoil 110 and the second aerofoil 115 are attached to the inner platforms 111, 121, i.e. the suction sides 107, 118 and the pressure sides 108, 119 extend from on to the other of the inner platforms 111, 121.

The suction sides 107, 118, the pressure sides 108, 119 and the inner platforms 111, 121 delimit, in the vane device 100 a gas path which is washed during operation of the gas turbine by a working fluid of the gas turbine.

The flow direction F of the working fluid in the gas turbine is indicated by the arrow shown in FIG. 1. The working fluid flows along the gas path of the vane device 100, from the respective leading edges 102, 116 of the respective aerofoils 101, 115 up to the respective trailing edges 103, 117 of the respective aerofoils 101, 115. At the trailing edges 103, 117 the working fluid flows away from the aerofoils 101, 115.

Figure 2:
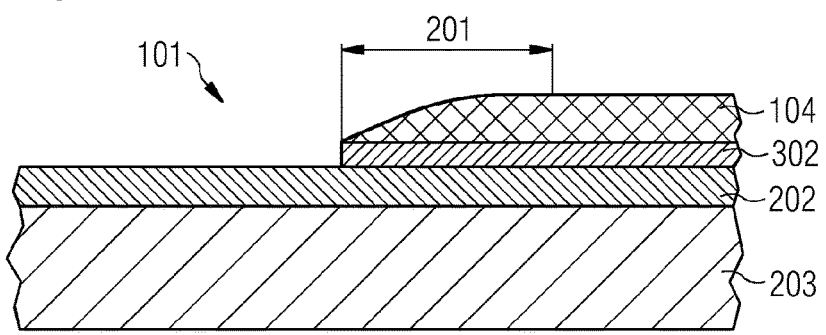
FIG. 2 shows an enlarged sectional view of a coated surface section of an aerofoil as shown in FIG. 1 according to an exemplary embodiment of the present invention.

Along the gas path, the first aerofoil 101, the second aerofoil 115 and the inner platforms 111, 121 are coated with a first layer 202 of MCrAlY coating (shown in FIG. 2). The first layer 202 is obtained by electroplating (EP) and provides a smooth surface along the gas path of the vane device 100. The first layer 202 provides an improved resistance to oxidation.

A further smoothing is achieved, according to a possible embodiment of the present invention, by applying a vibro-polishing process to the first layer 202 of MCrAlY after the electroplating process.

The MCrAlY composition comprises indicated by the "M" in particular Nickel (Ni), Cobalt (Co) or a mixture of both.

Along the gas path, at least the first suction side 107 comprises a coated surface section 104 which is coated with a thermal barrier coating (TBC) and which represents at least a part of the total surface of the first suction side 107. The thermal barrier coating 104 comprises a ceramic component. The coated surface section 104 provides, with respect to the first layer 202 of MCrAlY coating, additional protection at high temperature. It has been measured that the hottest sections of the surface of the respective aerofoils 101, 115 are in particular at the suction side 107, 118 of the respective aerofoils 101, 115. Hence, as shown in FIG. 1, the coated surface section 104 is coated onto the first suction side 107 of the first aerofoil 101 in order to increase the heat resistance. Furthermore, a respective coated surface section 104 may also be applied to a second suction side 118 of the second aerofoil 115.

The inner platform 111 and/or the further inner platform 121 comprise(s) the further coated surface section 106 in the exemplary embodiment as shown in FIG. 1.

In fact, it has been additionally found out that in a region along the inner platform 111, 121 downstream of the trailing edges 103, 117 of the aerofoils 101, 115 the hottest spots caused by the working fluid exist. Hence, by the present invention, at the downstream section of the respective inner platforms 111, 121 between the respective trailing edges 103, 117 and respective trailing edges 112, 122 of the respective inner platforms 111, 121 a further coated surface section 106 is applied.

The further coated surface section 106 is optional, and according to other embodiments of the present invention, may not be present.

According to other embodiments of the present invention, only the coated surface section 106 on the inner platform 111 and/or the further inner platform 121 is present, while the aerofoils 101, 115 are free from the coated surface section 104.

FIG. 2 shows a more detailed view of the coated surface section 104 at the first aerofoil 101 as shown in FIG. 1.

To a substrate 203 of the first aerofoil 101, the first layer 202 of MCrAlY coating is applied for improving the oxidation resistance. The material of the substrate 203 is a Mar-M-247 alloy.

According to other embodiments of the present invention, the material of the substrate 203 is another alloy.

On top of the first layer 202 of MCrAlY coating, the thermal barrier coating of the coated surface section 104 is applied. Between the first layer 202 of MCrAlY coating and the coated surface section 104, a second layer 302 of MCrAlY coating is provided.

The second layer 302 of MCrAlY coating is obtained by means of an Air Plasma Spray (APS) process and provides a rough surface, which is optimal for the bonding of the coated surface section 104.

As shown in FIG. 2, the coated surface section 104 comprises a thinning out section 201. Within the thinning out section 201, the thickness of the thermal barrier layer in the coated surface section 104 is reduced till zero thickness at an end edge of the coated surface section 104.

Figure 3:
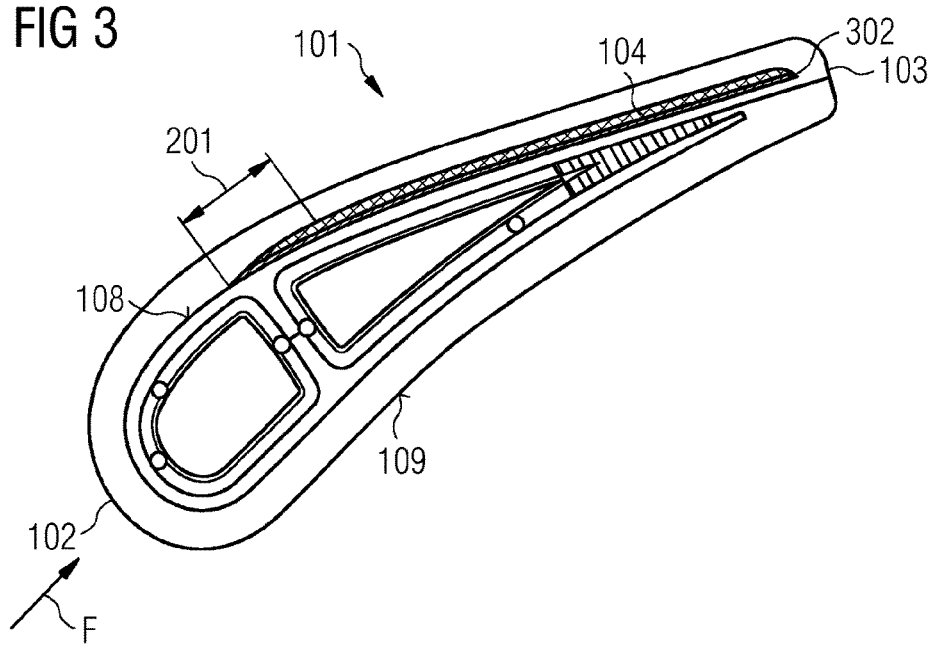
FIG. 3 shows a schematic view of an aerofoil comprising a coated surface section according to an exemplary embodiment of the present invention.

FIG. 3 shows more in detail the positioning of the coated surface section 104 on the first aerofoil 101.

As shown in FIG. 3, the thermal barrier layer of the coated surface section 104 is located at the suction side 108 of the first aerofoil 101. At the edge of the coated surface section 104 which is closer to the leading edge 102, a thinning out section 201 of the thermal barrier layer is applied in order to smoothly reduce the thickness of the thermal barrier layer till zero thickness.

Specifically, the coated surface section 104 is coated to the first aerofoil 101, over the second layer 302 of MCrAlY coating, between a maximum aerofoil thickness (measured e.g. along a line perpendicular to a chord line of a respective aerofoil 101, 115) of the aerofoil 101 and the trailing edge 103 of the first aerofoil 101. The section between the edge of the coated surface section 104 and the leading edge 102 is kept free from any thermal barrier layer.

Furthermore, as shown in FIG. 3, the pressure side 109 may be kept free from a thermal barrier coating. Furthermore, at an upstream section of the respective inner platforms 111, 121 between the respective leading edges 102, 116 and respective upstream leading edges 112, 122 of the respective inner platforms 111, 121 the surfaces may be kept free from a thermal barrier coating. Hence, only at the hottest region of the aerofoil 101, the thermal barrier coating is applied in order to effectively apply the thermal barrier coating and hence to reduce weight and costs.

Figure 4:
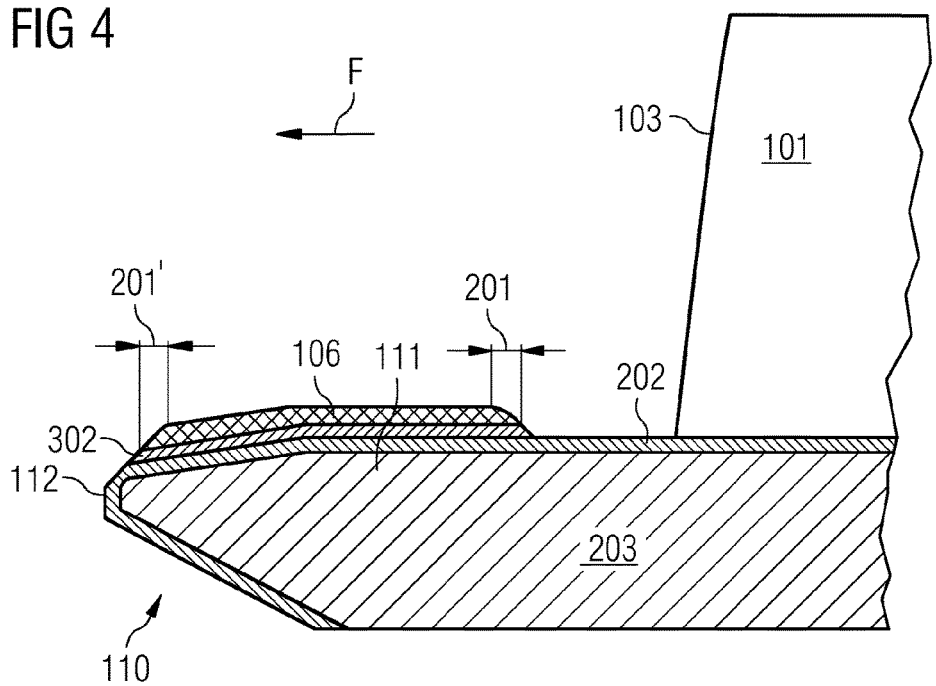
FIG. 4 shows a schematic view of an inner platform of a vane segment comprising a further coated surface section according to an exemplary embodiment of the present invention.

FIG. 4 shows an enlarged view of the inner shroud 110. The outer shroud 120 may be formed in a similar design.

Between a trailing edge 103 of the first aerofoil 101 and the trailing edge 112 of the inner platform 111 of the inner shroud 110, the further coated surface section 106 comprising the TBC coating is applied. At the respective upstream and downstream edges of the further coated surface section 106, a respective thinning out section 201, 201' is formed at which the thermal barrier coating is reduced till zero thickness. As shown in FIG. 4, a first layer 202 of MCrAlY coating is applied to the substrate 203. The first layer 202 of MCrAlY is applied along the inner surface of the inner platform 111 and around the trailing edge 112 of the inner platform 111. The further coated surface section 106 is applied over the second layer 302 of APS MCrAlY coating.

The further coated surface section 106 and the second layer 302 of APS MCrAlY coating are only applied at the inner surface of the inner platform 111 where the working fluid washes and contacts the surface of the inner platform 111.

Figure 5:
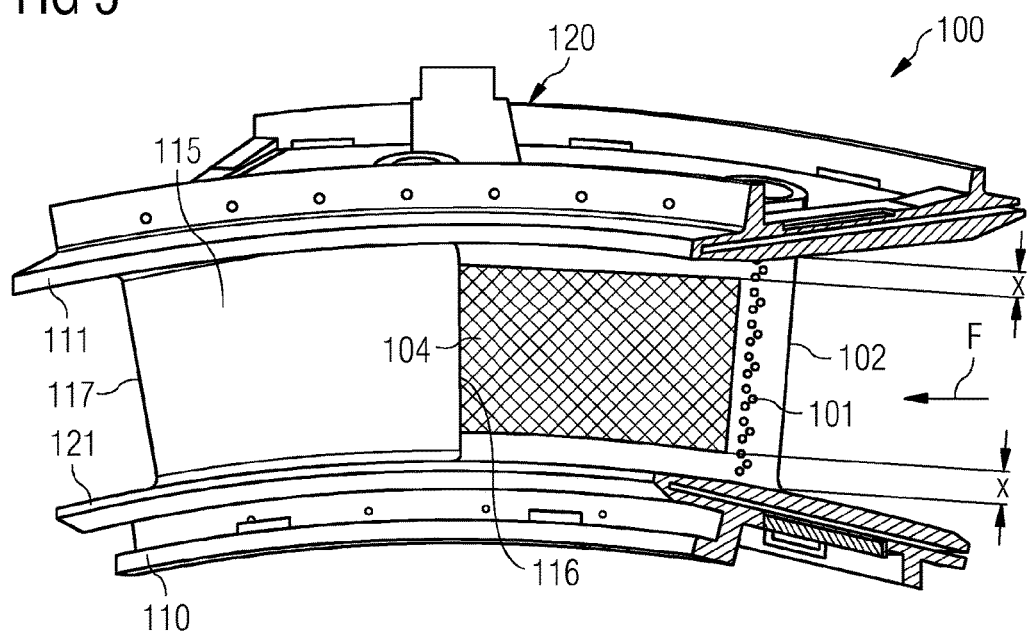
FIG. 5 shows a perspective view of a vane device according to an exemplary embodiment of the present invention.

FIG. 5 shows a perspective view of the vane device 100, wherein the vane device 100 comprises the inner shroud 110, the outer shroud 120, the first aerofoil 101 and the second aerofoil 115. The vane device 100 as shown in FIG. 5 may have the same features as shown in the sectional view shown in FIG. 1. Additionally, FIG. 5 shows the coated surface section 104, wherein the coated surface section 104 is spaced from the first leading edge 102 of the first aerofoil 101, as shown for example in FIG. 3. Furthermore, the coated surface section 104 is spaced apart by a distance x from the inner platform 111 and the further inner platform 121, for example.

In particular, the sections between the inner platform and the edges of the coated surface section 104 (i.e. so-called fillet sections) are free from the thermal barrier coating and only coated by the first layer 202 of electroplated MCrAlY, for example.

It should be noted that the term "comprising" does not exclude other elements or steps and "a" or "an" does not exclude a plurality. Also elements described in association with different embodiments may be combined. It should also be noted that reference signs in the claims should not be construed as limiting the scope of the claims.

The invention claimed is:

1. A vane device for a gas turbine, the vane device comprising:
   an inner shroud and an outer shroud,
   at least an airfoil arranged between the inner shroud and the outer shroud,
   the airfoil and/or the inner shroud and/or the outer shroud comprising a first layer of MCrAlY coating over a substrate for providing thermal protection to the substrate,
   a second layer of MCrAlY coating over the first layer of MCrAlY coating, and
   a thermal barrier coating over the first layer of MCrAlY coating and over the second layer of MCrAlY coating,
   wherein the second layer of MCrAlY coating comprises a roughness that is greater than a roughness of the first layer of MCrAlY coating, and
   wherein the first layer of MCrAlY coating covers more of the substrate than does the second layer of MCrAlY coating.

2. The vane device according to claim 1,
wherein the first layer of MCrAlY coating is obtained by means of an electroplating process.

3. The vane device according to claim 1,
wherein the second layer of MCrAlY coating is obtained by means of an air plasma spray process.

4. The vane device according to claim 1,
wherein the first layer of MCrAlY coating covers the entire substrate of the airfoil and/or the inner shroud and/or the outer shroud along a gas path of a working fluid of the gas turbine.

5. The vane device according to claim 1,
wherein the material of the substrate is Mar-M-247.

6. The vane device according to claim 1,
wherein the airfoil comprises a suction side and a pressure side, the suction side comprising at least a first coated surface section which is coated with the thermal barrier coating.

7. The vane device according to claim 1,
wherein the inner shroud and the outer shroud respectively comprise a first inner platform and a second inner platform, the first inner platform and/or the second inner platform comprising a coated surface section coated with the thermal barrier coating.

8. The vane device according to claim 7,
wherein the coated surface section is limited to a location downstream of a trailing edge of the airfoil.

9. The vane device according to claim 1,
wherein a pressure side of the airfoil is free from the thermal barrier coating.

10. The vane device according to claim 1,
wherein the first layer of MCrAlY coating covers the entire airfoil along a gas path of a working fluid of the gas turbine,
the vane device further comprising the thermal barrier coating applied to the second layer of MCrAlY coating but not to the first layer of MCrAlY coating,
wherein with respect to the airfoil the second layer of MCrAlY coating and the thermal barrier coating are limited to a suction side of the airfoil.

11. The vane device according to claim 1, further comprising an inner platform on at least one of the inner shroud and the outer shroud,
wherein the first layer of MCrAlY coating covers the inner platform along a gas path of a working fluid of the gas turbine,
the vane device further comprising the thermal barrier coating applied to the second layer of MCrAlY coating but not to the first layer of MCrAlY coating, wherein with respect to the inner platform the second layer of MCrAlY coating and the thermal barrier coating are limited to a location downstream of a trailing edge of the airfoil.

12. The vane device according to claim 1, wherein the first layer of MCrAlY coating covers the entire substrate of the airfoil and the inner shroud and the outer shroud along a gas path of a working fluid of the gas turbine.

13. The vane device according to claim 1, further comprising the thermal barrier coating applied to the second layer of MCrAlY coating but not to the first layer of MCrAlY coating, and wherein with respect to the airfoil the second layer of MCrAlY coating and the thermal barrier coating are limited to a suction side of the airfoil.

14. A method for manufacturing a vane device for a gas turbine, wherein the vane device comprises an inner shroud and an outer shroud, an airfoil arranged between the inner shroud and the outer shroud, the inner shroud, the outer shroud and the airfoil defining a gas path for a working fluid of the gas turbine, the method comprising:
coating a substrate of the airfoil and/or the inner shroud and/or the outer shroud with a first layer of MCrAlY coating for providing thermal protection to the substrate,
coating a second layer of MCrAlY coating over a portion of the first layer of MCrAlY coating,
coating a thermal barrier coating over the second layer of MCrAlY coating for providing a coated surface section comprising additional protection at high temperature,
wherein the second layer of MCrAlY coating comprises a roughness that is greater than a roughness of the first layer of MCrAlY coating, and
wherein the first layer of MCrAlY coating covers more of the substrate than does the second layer of MCrAlY coating.

15. The method according to claim 14,
wherein the first layer of MCrAlY coating is applied by an electro-plating (EP) process and the second layer of MCrAlY coating is applied by an Air Plasma Spray (APS) process.

16. The method according to claim 14,
wherein the first layer of MCrAlY coating is smoothed by means of a vibro-polishing process.

17. The method according to claim 14,
wherein the thermal barrier coating is applied by an Electron Beam Physical Vapour Deposition or an Air Plasma Spray (APS) process.

* * * * *